(12) United States Patent
Kobayashi et al.

(10) Patent No.: US 7,804,375 B2
(45) Date of Patent: Sep. 28, 2010

(54) MODULATION CIRCUIT

(75) Inventors: Norio Kobayashi, Tokyo (JP); Hideyuki Okabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 439 days.

(21) Appl. No.: 11/874,937

(22) Filed: Oct. 19, 2007

(65) Prior Publication Data

US 2009/0102573 A1    Apr. 23, 2009

(51) Int. Cl.
*H03C 3/00*    (2006.01)
(52) U.S. Cl. .................. 332/100; 332/128; 332/117; 332/119; 455/318; 455/323; 455/326; 455/327
(58) Field of Classification Search .............. 332/117, 332/123, 119, 100, 128; 455/260, 326, 323, 455/318, 327
See application file for complete search history.

(56) References Cited

U.S. PATENT DOCUMENTS 5,428,839 A * 6/1995 Friesen et al. ............. 455/326

* cited by examiner

*Primary Examiner*—Arnold Kinkead
(74) *Attorney, Agent, or Firm*—Osha • Liang LLP (57) ABSTRACT

A modulation circuit is provided that generates an output signal obtained by modulating an input signal with a local signal and includes a local input section that receives the local signal and generates the local signal and an inverted local signal obtained by inverting the local signal, a signal input section that receives the input signal and generates the input signal and an inverted input signal obtained by inverting the input signal, a first multiplying section that outputs from a terminal that receives the input signal a first multiplied signal obtained by multiplying the local signal with the input signal, a second multiplying section that outputs from a terminal that receives the inverted input signal a second multiplied signal obtained by multiplying the inverted local signal with the inverted input signal, an output section that adds the first multiplied signal to the second multiplied signal and generates the output signal, and a transmission line that sends to the output section the first multiplied signal output by the first multiplying section and the second multiplied signal output by the second multiplying section and has an electrical length according to a predetermined frequency as the frequency of the input signal.

14 Claims, 6 Drawing Sheets

MODULATION CIRCUIT

BACKGROUND

1. Technical Field

The present invention relates to a modulation circuit and, more particularly, the present invention relates to a modulation circuit that generates an output signal obtained by frequency-modulating an input signal with a local signal.

2. Related Art

Conventionally, in fields relating to measuring devices or wireless communication, a modulator is known that shifts a frequency of an input signal (a base band signal) according to a local signal. Furthermore, as such a modulator, a circuit is known that uses a ring FET or a resistive FET.

A modulator using the resistive FET inputs a local signal into a gate terminal of a FET having a grounded source and inputs an input signal into a drain terminal of the FET having a grounded source. Through such a configuration, a signal obtained by multiplying the local signal by the input signal is output from the drain terminal of the FET. In other words, the resistive FET has a relatively favorable IP3 (third intercept point) characteristic because the source terminal is grounded and has a small circuit size because only a single FET is used in the configuration.

In a modulator using the resistive FET, however, the input signal is supplied to the same terminal of the FET (the drain) as the output signal is taken from. Therefore, in the modulator described above, the input signal and the output signal are separated by a filter. For example, in a case where an output signal obtained by shifting a frequency of the input signal to a higher frequency is generated (up-conversion), the input signal and the output signal can be separated by disposing a low-pass filter between the input terminal and the drain terminal and disposing a high-pass filter between the output terminal and the drain terminal. Furthermore, in a case where an output signal obtained by shifting a frequency of the input signal to a lower frequency is generated (down-conversion), the input signal and the output signal can be separated by disposing the high-pass filter between the input terminal and the drain terminal and disposing the low-pass filter between the output terminal and the drain terminal.

In the manner described above, the modulator using the resistive FET has a different filter configuration in a case of up-conversion than in a case of down-conversion. Therefore, a single modulator cannot have both a down-converting function and an up-converting function.

On the other hand, a modulator using a ring FET is inferior to the modulator using the resistive FET in regards to the IP3 characteristics and the circuit size. In the modulator using the ring FET, however, it is not necessary to include a filter for separating the input signal and the output signal because the input signal and the output signal are transmitted with different lines, so that a single modulator can have both the down-converting function and the up-converting function. However, a modulator having both the down-converting function and the up-converting function, favorable IP3 characteristics, and a small circuit size is not yet known.

SUMMARY

Therefore, it is an object of an aspect of the present invention to provide a modulation circuit, which is capable of overcoming the above drawbacks accompanying the related art. The above and other objects can be achieved by combinations described in the independent claims. The dependent claims define further advantageous and exemplary combinations of the present invention.

According to a first aspect related to the innovations herein, one exemplary circuit may include a modulation circuit that generates an output signal obtained by modulating an input signal with a local signal. The modulation circuit includes a local input section that receives the local signal and generates the local signal and an inverted local signal obtained by inverting the local signal, a signal input section that receives the input signal and generates the input signal and an inverted input signal obtained by inverting the input signal, a first multiplying section that outputs from a terminal that receives the input signal a first multiplied signal obtained by multiplying the local signal with the input signal, a second multiplying section that outputs from a terminal that receives the inverted input signal a second multiplied signal obtained by multiplying the inverted local signal with the inverted input signal, an output section that adds the first multiplied signal to the second multiplied signal and generates the output signal, and a transmission line that has an electrical length according to a predetermined frequency as the frequency of the input signal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
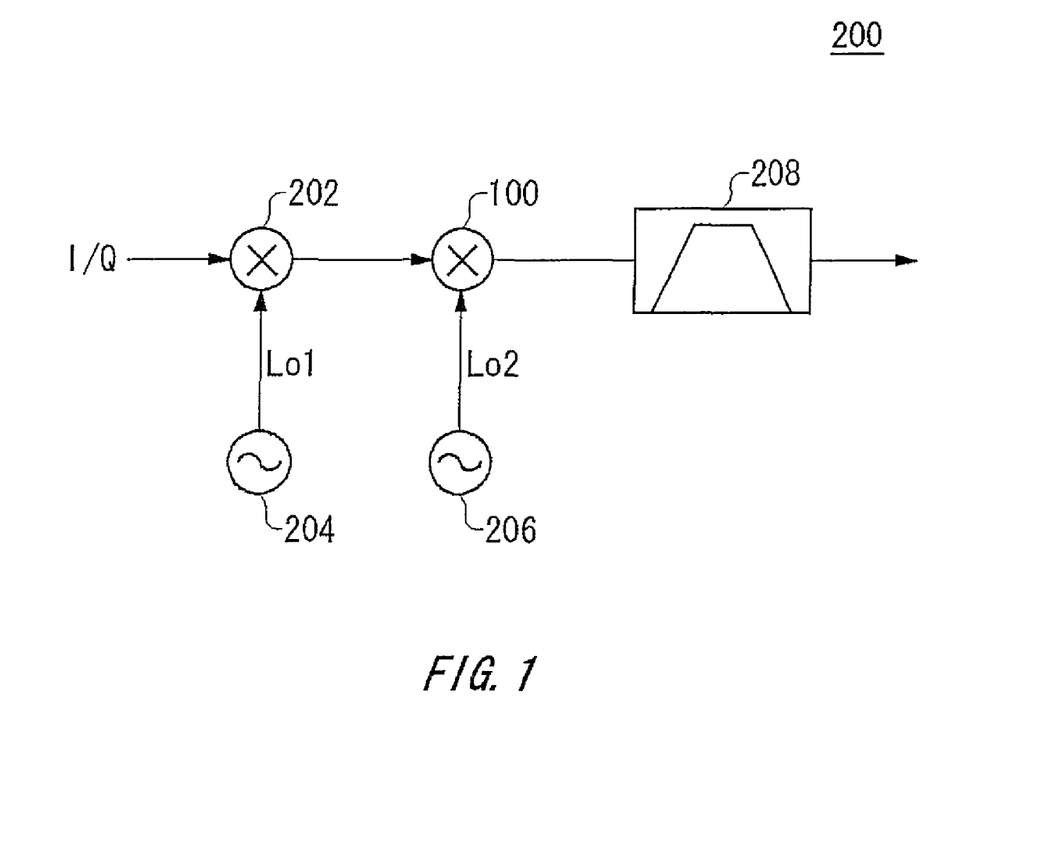
FIG. 1 shows an exemplary configuration of a modulation apparatus 200 according to an embodiment of the present invention.

FIG. 1 shows an exemplary configuration of a modulation apparatus 200 according to an embodiment of the present invention. The modulation apparatus 200 generates an output signal obtained by frequency-modulating an input signal (I/Q) with a local signal. Furthermore, the modulation apparatus 200 generates a spread spectrum signal as the output signal. The modulation apparatus 200 of the present embodiment is provided with a first modulation circuit 202, a second modulation circuit 100, a first local signal generating section 204, a second local signal generating section 206, and a filter 208.

In the modulation apparatus 200 of the present embodiment, the frequency of the signal output by the first modulation circuit 202 is set to be a frequency between the input signal and the output signal. In the second modulation circuit 100, the output signal having the desired frequency is generated and a spectrum thereof is spread by frequency hopping. Through the configuration described above, an output signal having a spread broadband spectrum can be accurately generated.

The first local signal generating section 204 generates a first local signal Lo1. The first local signal generating section 204 generates the first local signal Lo1 having a constant frequency within a predetermined frequency range.

The first modulation circuit 202 generates a signal obtained by shifting the frequency of the input signal according to the frequency of the first local signal Lo1. For example, the first modulation circuit 202 generates a signal having a frequency obtained by adding or subtracting the frequency of the input signal and the frequency of the first local signal Lo1. Here, because the frequency of the first local signal Lo1 can be set within a prescribed frequency range, the signal output by the first modulation circuit 202 has a frequency range according to the frequency range of the first local signal Lo1. The frequency range of the signal output by the first modulation circuit 202 in the present embodiment may be 3~6 GHz, for example.

The second local signal generating section 206 generates a second local signal Lo2. The second local signal generating section 206 generates the second local signal Lo2 within a predetermined frequency range. Furthermore, the second local signal generating section 206 changes the frequency of the second local signal Lo2 for every small prescribed unit of time.

The second modulation circuit 100 generates a signal obtained by shifting the frequency of the signal output by the first modulation circuit 202 according to the frequency of the second local signal Lo2. In the same manner as the signal output by the first modulation circuit 202, the signal output by the second modulation circuit 100 has a frequency range according to the frequency range of the second local signal Lo2. The frequency range of the signal output by the second modulation circuit 100 in the present embodiment may be 3~12 GHz, for example. A prescribed frequency component of the signal output by the second modulation circuit 100 is passed through the filter 208.

Here, because the frequency range of the signal input into the second modulation circuit 100 (for example, 3~6 GHz) overlaps with the frequency of the signal output by the second modulation circuit 100 (for example, 3~12 GHz), a magnitude correlation between the frequency of the signal input into the second modulation circuit 100 and the frequency of the signal output by the second modulation circuit 100 does not necessarily remain constant.

In other words, it is desirable that the second modulation circuit 100 can function as either a down-converter or an up-converter. Furthermore, it is desirable that the second modulation circuit 100 have favorable IP3 characteristics and a small circuit size.

Figure 2:
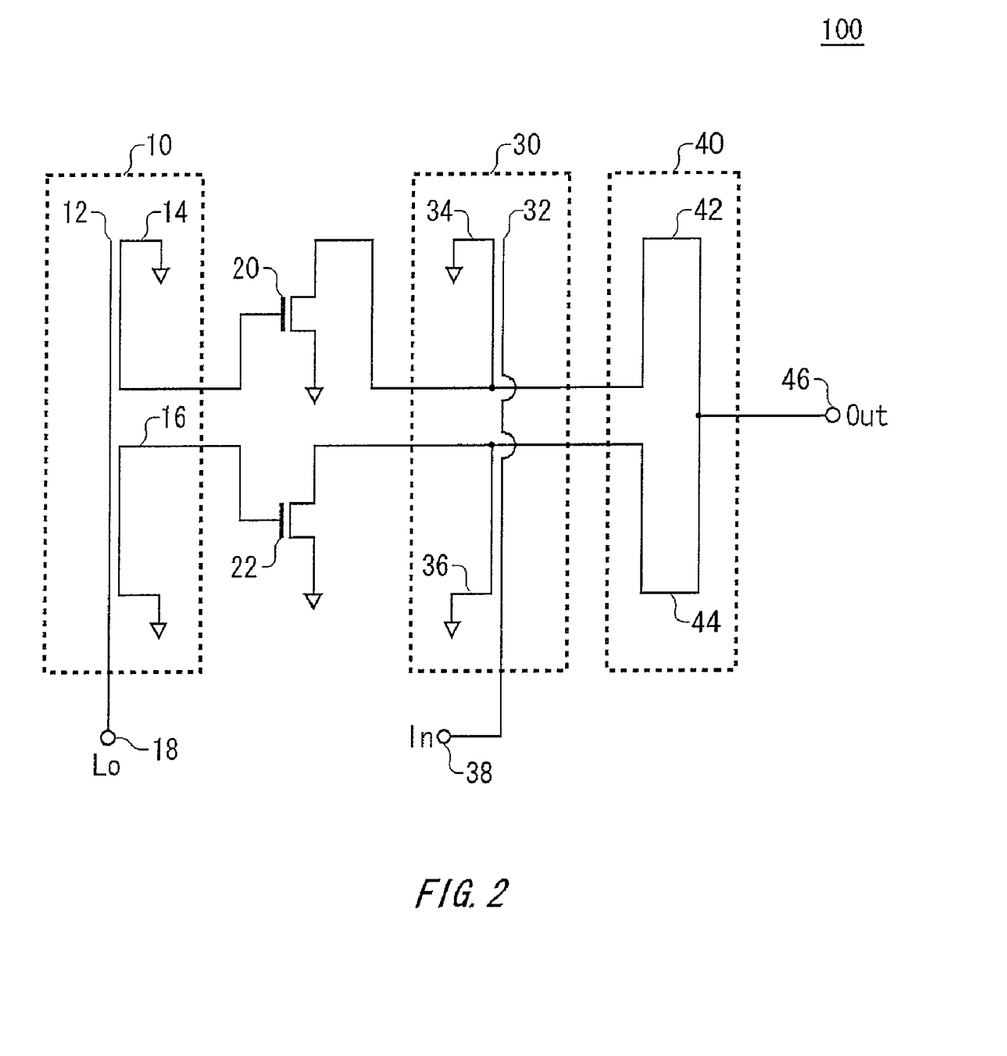
FIG. 2 shows an exemplary configuration of a second modulation circuit 100.

FIG. 2 shows an exemplary configuration of the second modulation circuit 100. The second modulation circuit 100 generates an output signal Out obtained by modulating an input signal In from the first modulation circuit 202 with a local frequency Lo from the second local signal generating section 206. The second modulation circuit 100 is provided with a local input section 10, a first multiplying section 22, a second multiplying section 20, a signal input section 30, a transmission line 40, a local input terminal 18, a signal input terminal 38, and an output section 46.

The local input section 10 receives the local signal Lo from the second local signal generating section 206 and outputs a local signal and an inverted local signal. The inverted local signal may be a signal having a phase 180 degrees different from that of the local signal. For example, the local input section 10 may output the local signal and the inverted local signal using a Marchand balun.

The local input section 10 of the present embodiment includes an unbalanced line 12, a first balanced line 16, and a second balanced line 14. One end of the unbalanced line 12 may be connected to the local input terminal 18 and the other end may be an open end line. The first balanced line 16 is disposed parallel to the unbalanced line 12 in a manner to span a prescribed length from an end of the unbalanced line 12. The first balanced line 16 is configured to be a coupling line with the unbalanced line 12 and outputs generally the same signal as the local signal Lo.

The second balanced line 14 is disposed parallel to the unbalanced line 12 in a manner to span a prescribed length from the open end of the unbalanced line 12. The second balanced line 14 is configured to be a coupling line with the unbalanced line 12 and outputs an inverted local signal obtained by inverting the local signal Lo.

The signal input section 30 receives the input signal In and outputs both the input signal In and an inverted input signal obtained by inverting the input signal In. In the same manner as the local input section 10, the signal input section 30 may generate the input signal and the inverted input signal using a Marchand balun. In the same manner as the local input section 10, the signal input section 30 of the present embodiment includes an unbalanced line 32, a first balanced line 36, and a second balanced line 34.

The first multiplying section 22 outputs a signal obtained by multiplying the input signal from the signal input section 30 with the local signal from the local input section 10. The first multiplying section 22 of the present embodiment may be a transistor in which a source terminal is grounded, a gate terminal is connected to the first balanced line 16, and a drain terminal is connected to the first balanced line 36. In other words, in the first multiplying section 22, the gate terminal receives the local signal and the drain terminal receives the input signal. Furthermore, the first multiplying section 22 outputs, from the terminal that receives the input signal (the drain terminal), the signal obtained by multiplying the local signal with the input signal.

The second multiplying section 20 outputs a signal obtained by multiplying the inverted input signal from the signal input section 30 with the inverted local signal from the local input section 10. In the same manner as the first multiplying section 22, the second multiplying section 20 may be a transistor in which a source terminal is grounded, a gate terminal is connected to the second balanced line 14, and a drain terminal is connected to the second balanced line 34.

The transmission line 40 transmits to the output terminal 46 a first multiplied signal output by the first multiplying section 22 and a second multiplied signal output by the second multiplying section 20. The output terminal 46 functions as an output section that generates an output signal by adding the first multiplied signal to the second multiplied signal.

Furthermore, the transmission line 40 includes a first line 44 and a second line 42. The first line 44 connects the drain terminal of the first multiplying section 22 to the output terminal 46. The second line 42 connects the drain terminal of the second multiplying section 20 to the output terminal 46. The first balanced line 36 may be connected to the first line 44 and the second balanced line 34 may be connected to the second line 42.

Through the configuration described above, an output signal obtained by shifting the frequency of the input signal according to the frequency of the local signal can be generated. Furthermore, because the modulation circuit 100 of the present embodiment uses the resistive FET, favorable IP3 characteristics and small circuit size can be achieved.

Furthermore, the input signal and the output signal are input into the transmission line 40. However, because a non-inverted input signal and the inverted input signal are input into the transmission line 40, the signals cancel each other out in the output terminal 46. Therefore, the functions of both a down-converter and an up-converter can be realized by a single resistive mixer without using a filter as in conventional modulators.

Furthermore, a case is considered where the local signal from the local input section 10 leaks into the transmission line 40. However, because the resulting leaked components are input into the transmission line 40 together with the noninverted signal and the inverted signal, the leaked components cancel each other out in the output section 46. Therefore, the modulation circuit 100 of the present embodiment can decrease the effect of leaked components of the local signal.

Furthermore, it is desirable that the transmission line 40 have an electrical length according to a predetermined frequency as the frequency of the input signal. In a case where a prescribed frequency range (for example, the aforementioned 3-6 GHz) is set as the frequency of the input signal, it is desirable that the transmission line 40 have an electrical length according to the frequency range. For example, the transmission line 40 may have an electrical length according to a quarter of a wavelength corresponding to a central frequency (for example, 4.5 GHz) of the frequency range. Here, the electrical length of the transmission line 40 may indicate the electrical length of either one of the first line 44 and the second line 42. It is desirable that the electrical length of the first line 44 and the electrical length of the second line 42 be equal.

The predetermined frequency or frequency range set as the frequency of the input signal is not limited to a frequency or a frequency range set by the modulation circuit 100. The frequency or the frequency range may indicate a frequency or a frequency range determined by a specification of the modulation circuit 100. Furthermore, the frequency or the frequency range may indicate a frequency or a frequency range set by an external device. For example, the predetermined frequency range set as the frequency of the input signal may be a frequency range determined to include the frequency or the frequency range of an output set by the first modulator 202 or may be determined to include the frequency or the frequency range set by the first local signal generating section 204.

For example, in a case where the wavelength corresponding to the central frequency or the frequency that is set as the input signal frequency is $\lambda$, the electrical length of the transmission line 40 may be approximately equal to $\lambda/4 + n \times \lambda/2$ (n is an integer).

In a case where the transmission line 40 is a lossless line, a negative impedance Z as seen from the signal input section 30 is provided in the equation below.

$$Z = Z_0 \frac{Z_r + jZ_0 \tan\beta l}{Z_0 + jZ_r \tan\beta l}$$

It is to be noted that Z0 represents characteristic impedance of the transmission line 40, Zr represents negative impedance, β represents a phase constant ($2\pi/\lambda$), and l represents the electrical length of the transmission line 40.

From the above equation, in a case where the electrical length of the transmission line 40 is a quarter of the wavelength of the input signal, the negative impedance as seen from the signal input section 30 becomes Z=Z0×Z0/Zr. The transmission line 40 may have a characteristic impedance Z0 to cause the impedance Z to be sufficiently large. Furthermore, the transmission line 40 may have a characteristic impedance Z0 in relation to input signals having frequencies at an end of the frequency range (for example, 3 GHz and 6 GHz) such that the transmission line 40 appears to be open as seen from the signal input section 30.

Furthermore, in a case where the modulation circuit 100 is formed on a semiconductor substrate or the like, there is a case where a sufficient length of the electrical length of the transmission line 40 cannot be ensured where the transmission line 40 is formed linearly. The first line 44 may include an indentation that is perpendicular to a straight line between the first multiplying section 22 and the output terminal 46. In the same manner, the second line 42 may include an indentation that is perpendicular to a straight line between the second multiplying section 20 and the output terminal 46.

Through the configuration described above, a modulation circuit 100 can be realized that uses a resistive FET and has both a down-converting function and an up-converting function. In other words, a modulation circuit 100 can be realized that has favorable IP3 characteristics and small circuit size and can perform both up-conversion and down-conversion.

Figure 3:
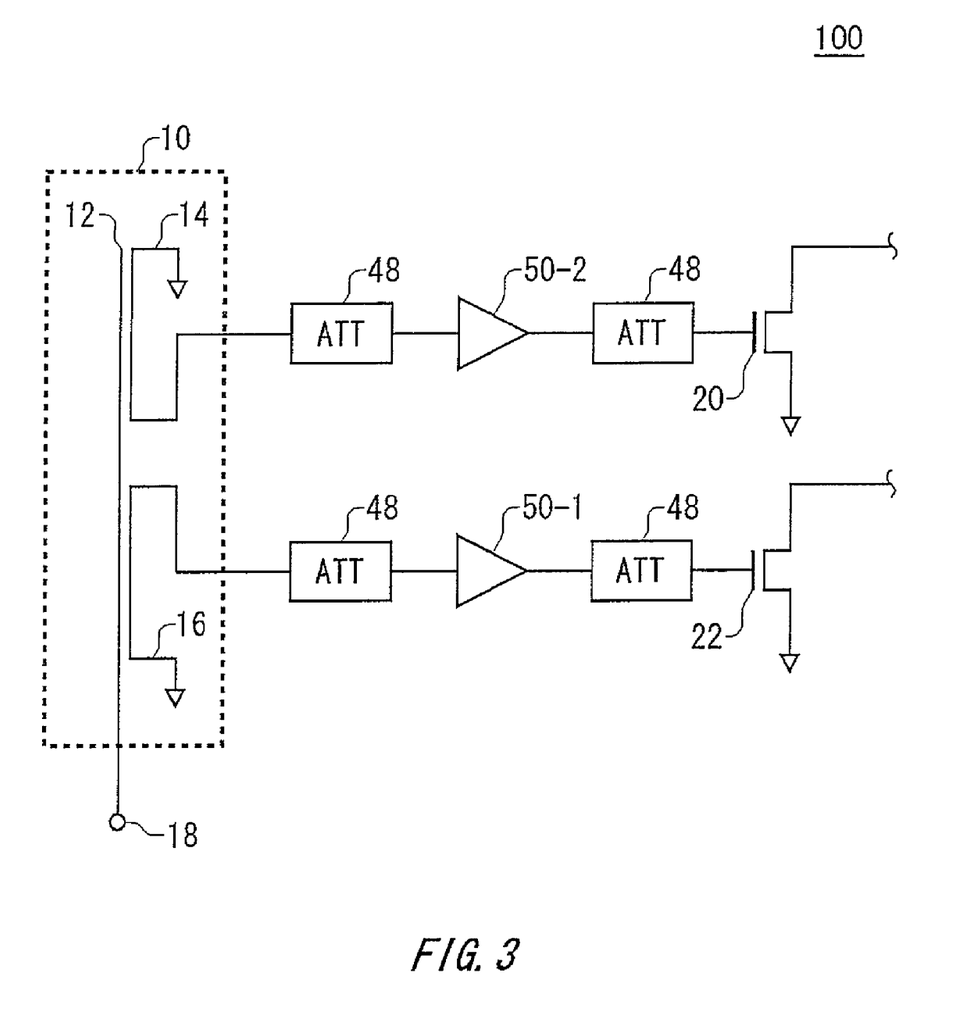
FIG. 3 shows another exemplary configuration of the modulation circuit 100.

FIG. 3 shows another exemplary configuration of the modulation circuit 100. The modulation circuit 100 is further provided with a first amplifier 50-1, a second amplifier 50-2 and a plurality of attenuators 48 in addition to the configuration of the modulation circuit 100 described in FIG. 2. Other parts of the configuration may be the same as those of the modulation circuit 100 described in FIG. 2.

The first amplifier 50-1 receives the local signal from the local input section 10, amplifies the local signal by a prescribed amplification factor, and supplies the amplified signal to the first multiplying section 22. The first amplifier 50-1 of the present embodiment is disposed between the first balanced line 16 and the gate terminal of the first multiplying section 22. The second amplifier 50-2 receives the inverted local signal from the local input section 10, amplifies the inverted local signal by a prescribed amplification factor, and supplies the amplified signal to the second multiplying section 20. The second amplifier 50-2 of the present embodiment is disposed between the second balanced line 14 and the gate terminal of the second multiplying section 20.

Through the configuration described above, power loss can be compensated for in the local input section 10 and the local signal and the inverted local signal can be supplied to the first multiplying section 22 and the second multiplying section 20. For example, power loss between the unbalanced line 12 and the balanced lines (14, 16) can be compensated for.

Furthermore, disposing an amplifier between the local input terminal 18 and the local input section 10 is considered as a means to compensate for the power loss. However, as shown in the present embodiment, the amount of loss can be decreased in the local input section 10 by disposing the amplifier 50 between the local input section 10 and the multiplying sections (20, 22).

For example, in a case where the power of the local signal supplied to the local input terminal 18 is 1 W, the power of signal input into each amplifier is 0.5 W, and the loss between the unbalanced line and the balanced line is ¾, the modulation circuit 100 of the present embodiment includes an amplifier 50 having an amplification factor of two disposed between the local input section 10 and the multiplying sections (20, 22). At this time, the loss in the local input section 10 becomes 1−(0.25×2)=0.5 W.

On the other hand, in a case where the amplifier is disposed between the local input terminal 18 and the local input section 10, a 2 W local signal is supplied to the local input section 10 using an amplifier having an amplification factor of two. A signal of 0.5 W then arises in each of the balanced lines. At this time, the loss in the local input section 10 becomes 2−(0.5×2)=1 W. By disposing the amplifier 50 between the local signal input section 10 and the multiplying sections (20, 22) as described above, the amount of loss in the local input section 10 can be more effectively compensated for.

Furthermore, by disposing the amplifier 50 in the aforementioned location, transmission separation between the amplifier 50 and the multiplying sections (20, 22) can be decreased. Therefore, the loss between the amplifier 50 and the multiplying sections can be decreased and the effect of higher harmonics can also be decreased. In addition, isolation can be achieved between the local input section 10 and the multiplying sections (20, 22). It is desirable that the first multiplying section 22 and the second multiplying section 20 be formed on the same chip to have the same characteristics.

Furthermore, the attenuators 48 are disposed on an input side and an output side of both the first amplifier 50-1 and the second amplifier 50-2. Therefore, the operation of the first amplifier 50-1 and the second amplifier 50-2 can be stabilized and vibration can be controlled. Attenuation of each attenuator 48 may be 2 dB, for example.

Figure 4:
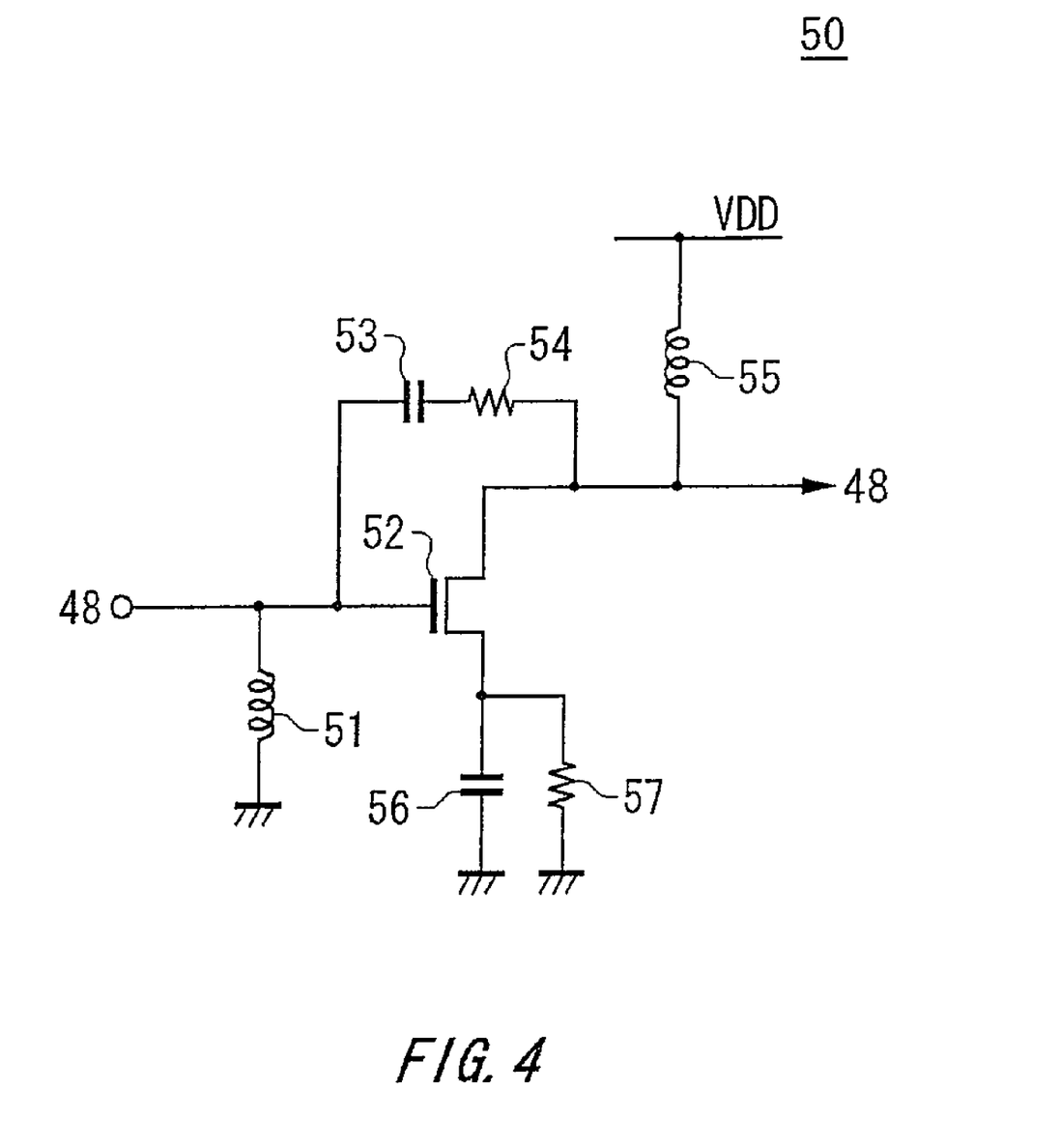
FIG. 4 shows an exemplary configuration of a first amplifier 50-1 and a second amplifier 50-2.

FIG. 4 shows an exemplary configuration of the first amplifier 50-1 and the second amplifier 50-2. The first amplifier 50-1 and the second amplifier 50-2 may each include the amplifier 50 configuration shown in FIG. 4.

The amplifier 50 includes a plurality of resistors (51, 54, 57), a plurality of capacitors (53, 56), a transistor 52, and a plurality of inductors (51, 55). The transistor 52 receives the signal from the local input section 10 at the gate terminal and the drain terminal is connected to the multiplying sections (20, 22). Furthermore, the capacitor 56 and the resistor 57 are disposed in parallel between the source terminal of the transistor 52 and the ground.

The resistor 54 and the capacitor 53 are disposed serially between the drain terminal and the gate terminal of the transistor 52. Therefore, an AC component of the signal output by the transistor 52 can be returned to the gate terminal of the transistor 52 and the oscillation of the amplifier 50 can be controlled.

Furthermore, the inductor 51 is disposed between the gate terminal of the transistor 52 and the ground. The inductor 55 is disposed between the drain terminal of the transistor 52 and a reference potential VDD.

Figure 5:
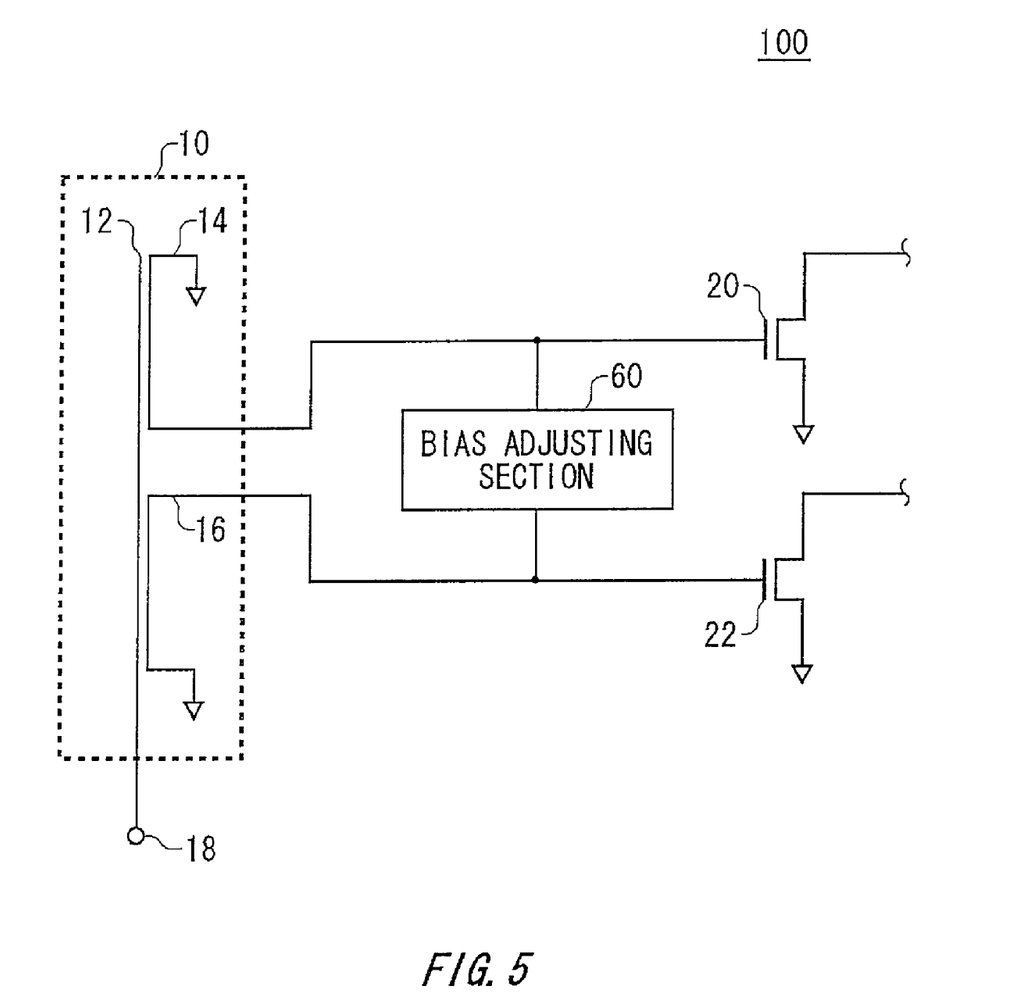
FIG. 5 shows another exemplary configuration of the modulation circuit 100.

FIG. 5 shows another exemplary configuration of the modulation circuit 100. The modulation circuit 100 is further provided with a bias adjusting section 60 in addition to the configuration of the modulation circuit 100 described in any one of FIGS. 2 to 4. Other parts of the configuration may be the same as those of the modulation circuit 100 described in FIGS. 2 to 4.

The bias adjusting section 60 adjusts the gate bias of the transistor in the first multiplying section 22 and the second multiplying section 20 based on the desired frequency of the output signal. Furthermore, the bias adjusting section 60 may adjust the gate bias based on the frequency of the local signal set by the first local signal generating section 204 and the second local signal generating section 206.

The bias adjusting section 60 may adjust the gate bias in a manner to optimize the IP3 of the modulation circuit 100. For example, the bias adjusting section 60 may measure the gate bias that optimizes the IP3 in advance for every frequency of the output signal. Furthermore, the bias adjusting section 60 may be provided in advance with a table that indicates the gate bias to be set for every frequency of the output signal.

Figure 6:
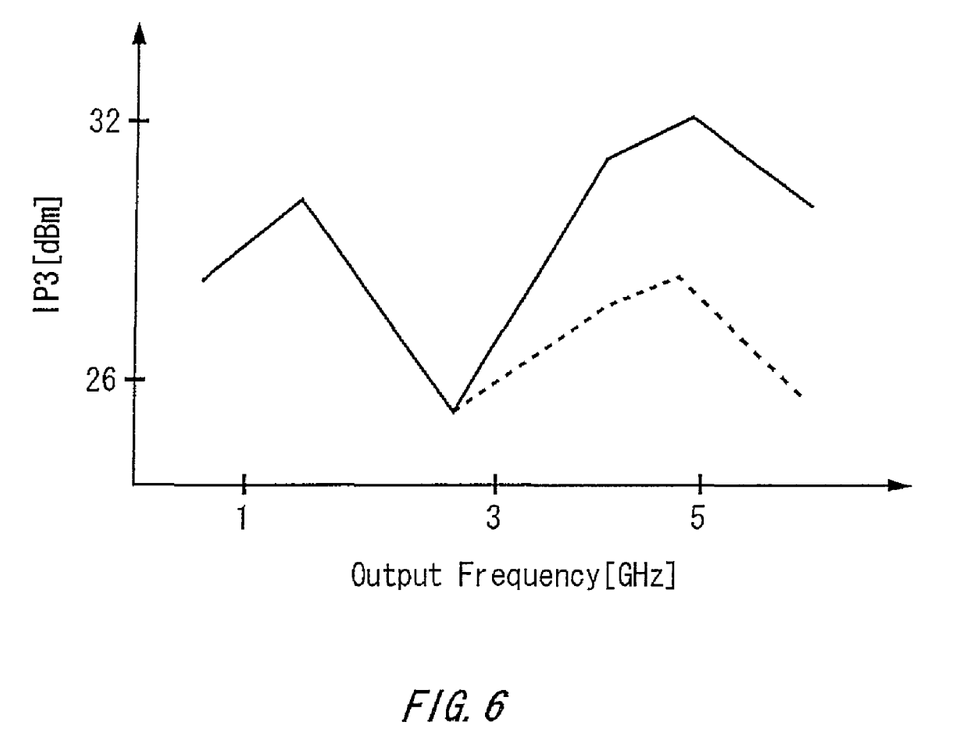
FIG. 6 shows a measurement value of an IP3 in a case where a gate bias is fixed and a measurement value of the IP3 in a case where the gate bias is adjusted.

FIG. 6 shows a measurement value of the IP3 in a case where the gate bias is fixed and a measurement value of the IP3 in a case where the gate bias is adjusted. In FIG. 6, the measurement value of the IP3 in a case where the gate bias is fixed is shown by a dotted line and the measurement value of the IP3 in a case where the gate bias is adjusted is shown by a solid line. As shown in FIG. 6, the IP3 can be enhanced in a high frequency range by adjusting the gate bias.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

As made clear from the above description, through an embodiment of the present invention, both an up-converting function and a down-converting function can be included in a modulation circuit that uses a resistive FET. Therefore, a modulation circuit is realized that has favorable IP3, a small circuit size, and both an up-converting function and a down-converting function.

What is claimed is:

1. A modulation circuit that generates an output signal obtained by modulating an input signal with a local signal, comprising:

a local input section that receives the local signal and generates the local signal and an inverted local signal obtained by inverting the local signal;

a signal input section that receives the input signal and generates the input signal and an inverted input signal obtained by inverting the input signal;

a first multiplying section that outputs from a terminal that receives the input signal a first multiplied signal obtained by multiplying the local signal with the input signal;

a second multiplying section that outputs from a terminal that receives the inverted input signal a second multiplied signal obtained by multiplying the inverted local signal with the inverted input signal;

an output section that adds the first multiplied signal to the second multiplied signal and generates the output signal; and a transmission line that has an electrical length according to a predetermined frequency as the frequency of the input signal, wherein the first multiplying section and the second multiplying section each include a transistor in which a source terminal is connected to a reference potential, a drain terminal is connected to the transmission line and the signal input section, and a gate terminal receives the signal from the local input section.

2. The modulation circuit according to claim 1, wherein the transmission line includes:

a first line that connects the first multiplying section and the output section; and a second line that connects the second multiplying section and the output section.

3. The modulation circuit according to claim 1, wherein:
   a predetermined frequency range is set as the frequency of the input signal; and
   the transmission line has an electrical length according to the frequency range of the input signal.

4. The modulation circuit according to claim 3, wherein the transmission line has an electrical length according to a quarter of a wavelength corresponding to a central frequency of the frequency range.

5. The modulation circuit according to claim 3, further comprising:
   a first amplifier that receives the local signal from the local input section, amplifies the local signal by a prescribed amplification factor, and supplies the amplified local signal to the first multiplying section; and
   a second amplifier that receives the inverted local signal from the local input section, amplifies the inverted local signal by a prescribed amplification factor, and supplies the amplified inverted local signal to the second multiplying section.

6. The modulation circuit according to claim 5, wherein attenuators are disposed at an input side and an output side of both the first amplifier and the second amplifier.

7. The modulation circuit according to claim 6, wherein the first amplifier and the second amplifier each include a transistor in which a gate terminal is connected to the attenuator on the input side, a drain terminal is connected to the attenuator on the output side, and the drain terminal and the gate terminal are connected via a capacitor.

8. The modulation circuit according to claim 7, wherein the first amplifier and the second amplifier each further include a resistor and a capacitor disposed in parallel between a source terminal of the transistor and a reference potential.

9. The modulation circuit according to claim 3, further comprising a bias adjusting section that adjusts a gate bias of the transistor based on a frequency of the output signal.

10. The modulation circuit according to claim 1, further comprising:
    a first amplifier that receives the local signal from the local input section, amplifies the local signal by a prescribed amplification factor, and supplies the amplified local signal to the first multiplying section; and
    a second amplifier that receives the inverted local signal from the local input section, amplifies the inverted local signal by a prescribed amplification factor, and supplies the amplified inverted local signal to the second multiplying section.

11. The modulation circuit according to claim 10, wherein attenuators are disposed at an input side and an output side of both the first amplifier and the second amplifier.

12. The modulation circuit according to claim 11, wherein the first amplifier and the second amplifier each include a transistor in which a gate terminal is connected to the attenuator on the input side, a drain terminal is connected to the attenuator on the output side, and the drain terminal and the gate terminal are connected via a capacitor.

13. The modulation circuit according to claim 12, wherein the first amplifier and the second amplifier each further include a resistor and a capacitor disposed in parallel between a source terminal of the transistor and a reference potential.

14. The modulation circuit according to claim 1, further comprising a bias adjusting section that adjusts gate bias of the transistor based on a frequency of the output signal.

\* \* \* \* \*